United States Patent [19]

Heller et al.

[11] 4,028,558

[45] June 7, 1977

[54] HIGH ACCURACY MOS COMPARATOR

[75] Inventors: Lawrence Griffith Heller, Brewster; Lewis Madison Terman, South Salem; Yen Sung Yee, White Plains, all of N.Y.

[73] Assignee: International Business Machines Corporation, Armonk, N.Y.

[22] Filed: June 21, 1976

[21] Appl. No.: 698,622

[52] U.S. Cl. .............................. 307/355; 307/279; 307/DIG. 1; 307/DIG. 3; 328/165; 330/35
[51] Int. Cl.² ................... H03K 5/20; H03K 3/353; H03F 3/16; H04B 15/00
[58] Field of Search ........ 307/235 F, 235 H, 235 J, 307/235 T, 235 W, 246, 251, 264, 279, DIG. 3, DIG. 4, DIG. 1; 330/16, 35; 328/162, 165

[56] References Cited

UNITED STATES PATENTS

| | | | |
|---|---|---|---|
| 3,191,124 | 6/1965 | Brown | 307/235 T X |
| 3,588,537 | 6/1971 | Brink | 307/235 F |
| 3,676,702 | 7/1972 | McGrogan, Jr. | 307/279 X |
| 3,976,952 | 8/1976 | Shaver | 307/235 F X |
| 3,983,413 | 9/1976 | Gunsagar et al. | 307/DIG. 3 X |
| 3,993,917 | 11/1976 | Kalter | 307/DIG. 3 X |

Primary Examiner—John S. Heyman
Assistant Examiner—Larry N. Anagnos
Attorney, Agent, or Firm—Charles P. Boberg

[57] ABSTRACT

The voltages to be compared are applied to a passive MOS capacitor differencing circuit for producing a voltage difference signal, which then is amplified by a high-gain non-precision FET amplifier, the output of which is passed through a low output impedance FET buffer amplifier to a FET latching circuit. Capacitive coupling is used for enabling the amplifiers to be independently biased and to eliminate D.C. offsets. The operating cycle of the comparator has two periods. During an initial set-up or preconditioning period the amplifiers are self-biased by appropriate switching actions which cause each of the amplifiers to be set at a desired operating point that is maintained when its respective bias switching connection subsequently is opened. The bias switch openings in the respective amplifier and latching stages are timed to occur in a chosen sequence which causes the switching transients to be absorbed. At the end of the preconditioning period, the comparator is set up for operation in the comparison period during which the input signals are compared.

8 Claims, 2 Drawing Figures

HIGH ACCURACY MOS COMPARATOR

BACKGROUND OF THE INVENTION

The present invention relates to voltage comparators, and it is concerned particularly with the use of a voltage comparator under conditions where the voltages being compared differ very little from each other.

There is a growing demand for a comparator, particularly one that can be embodied in MOS (metal-oxide-semiconductor) integrated circuitry, which can reliably detect a voltage difference as small as one millivolt or less within a time period of a few microseconds or less. Prior known MOS comparators have not been designed in a way which is compatible with the stringent requirements just mentioned. Such circuits commonly are designed to sense voltage differences that are an order of magnitude larger than one millivolt in order that they will not be adversely affected by the transient signals which are generated by normal switching or strobing actions within the comparator and the built-in offsets which tend to obscure small input signals. This application presents a new approach to the design of MOS comparators whereby they can respond accurately and reliably to extremely small voltage differences notwithstanding the effects of transients and offsets that are inherent in the circuitry.

SUMMARY OF THE INVENTION

An object of the present invention is to provide an improved MOS comparator circuit that has extremely high accuracy and in which the effects of transients and offsets are nullified. As herein disclosed, such circuitry includes a combination of passive MOS capacitors and active MOS devices in the form of insulated-gate field effect transistors, hereinafter referred to as "FETs".

The invention features a novel circuit preconditioning action whereby all transients generated within the comparator circuit are caused to occur at times when the circuit is not passing a true signal and are effectively suppressed before the true voltage comparison signal is amplified and converted into its corresponding binary output signal, so that the accuracy of the comparator is not limited by the relationship between the magnitude of the true signal and the spurious transients. Even a relatively strong transient will have no adverse effect since it does not occur at a time when bona fide signal amplification is being performed. The circuit also cancels out built-in offsets by the use of techniques explained hereinafter. Very small voltage differences of about one millivolt or less can be reliably detected. This high degree of accuracy is achieved without sacrificing speed and performance. It has been found that the entire task of eliminating the offsets, suppressing transients and processing the true signal can be accomplished within a cycle time of a few microseconds or less when operating in this mode.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

Figure 1:
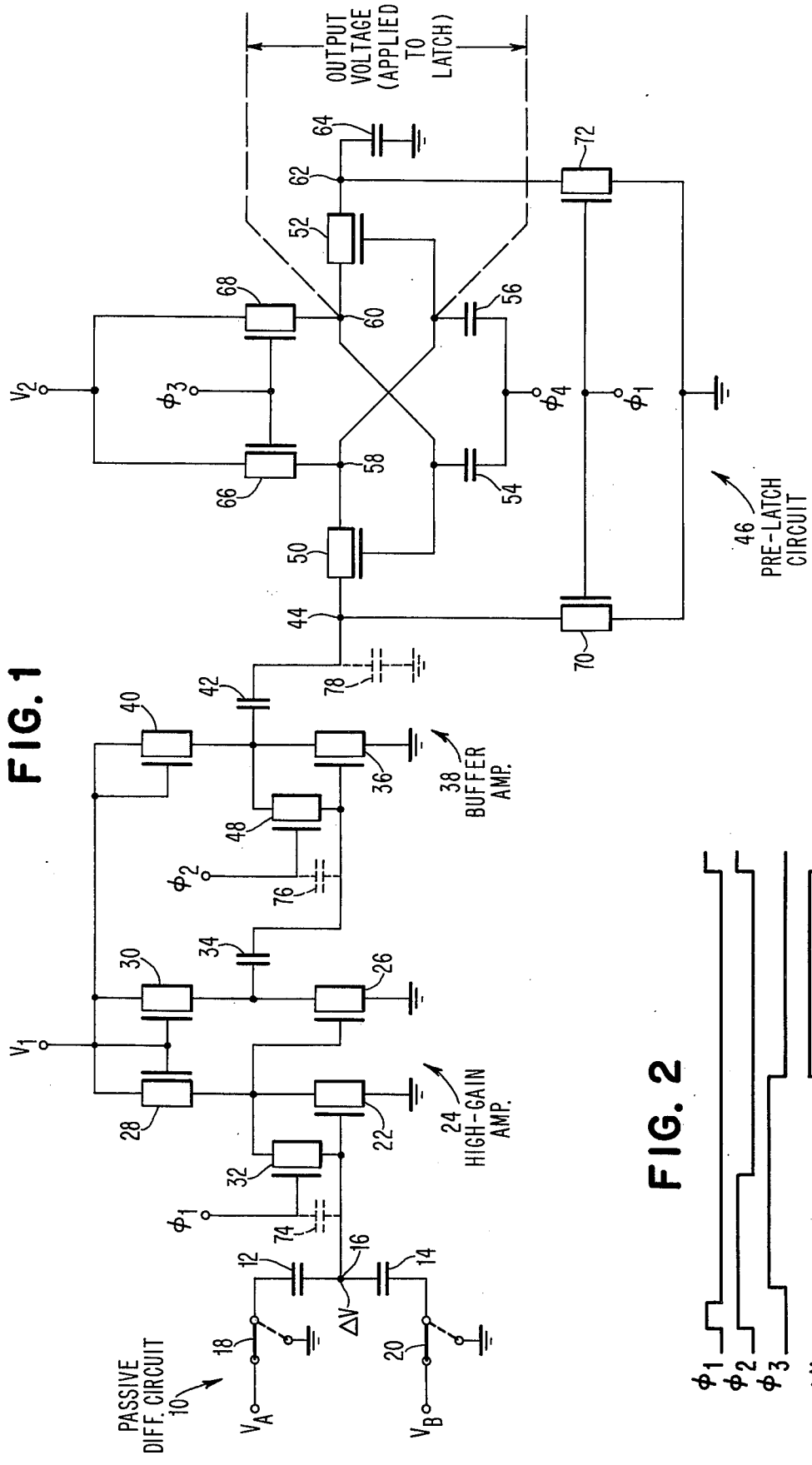
FIG. 1 is a circuit diagram of a voltage comparator embodied in MOS circuitry according to the invention.

The voltage comparator represented in FIG. 1 can be fabricated using conventional MOS technology. The voltages $V_A$ and $V_B$ which are being compared are applied to the terminals of a passive differencing circuit 10 which constitutes the input stage of the comparator. For convenience it will be assumed that $V_B$ is a reference potential with which signal voltage $V_A$ of unknown magnitude is being compared. The output of the differencing circuit 10 is a voltage $\Delta V$ which represents the difference between the magnitudes of the two input voltages $V_A$ and $V_B$. For a more detailed description of this differencing circuit, reference may be had to the article entitled "Magnitude Differencing Circuit" by D. L. Critchlow et al, published in the IBM Technical Disclosure Bulletin, Vol. 18, No. 9, February 1976, pages 3071 and 3072.

The differencing circuit 10 comprises two passive MOS capacitors 12 and 14 that are connected in series between the terminals to which the voltages $V_A$ and $V_B$ are applied. The difference voltage $\Delta V$ is developed at the common terminal 16 between the capacitors 12 and 14. The accuracy of a differencing circuit depends upon the extent to which the characteristics of the respective elements match each other. In MOS technology such matching characteristics can be more readily achieved with passive elements such as capacitors than with active devices such as transistors. Switching elements symbolically represented at 18 and 20 initially are caused to assume states such that when these switches subsequently are reversed, the resulting difference signal $\Delta V$ will represent the difference between the respective magnitudes of the input voltages $V_A$ and $V_B$ regardless of the polarities which these respective voltages may have. The initial state of each switch 18 or 20 is determined by the polarity of the respective input signal. These properties of the differencing circuit 10 are explained more fully in the aforesaid Critchlow et al article. The polarity of the signal $\Delta V$ denotes which of the input voltages $V_A$ and $V_B$ has the larger magnitude.

The difference signal $\Delta V$ developed at the output terminal 16 of the differencing circuit 10 is applied to the gate of an MOSFET 22 in the input stage of a high-gain non-precision FET amplifier 24, which amplifies the input signal and inverts its polarity. The drain terminal of the FET 22 is connected directly to the gate of FET 26 in the second stage of amplifier 24, which serves as an inverter with respect to the first amplifier-inverter stage. Power source voltage V1 is supplied to the drain terminals of FETs 22 and 26 through FETs 28 and 30, respectively, which are biased to operated in their saturation regions to serve as loads for the amplifier FETs 22 and 26.

As will be explained more fully hereinafter, the amplifier 24 is self-biased to its D.C. unity-gain operating point during the preconditioning period by means of FET 32, which momentarily establishes a connection between the gate and drain of the first-stage amplifier FET 22. By thus interconnecting the input and output nodes of FET 22 and then removing this connection, amplifier 24 is placed at the correct operating point on its characteristic for high amplification of the difference signal $\Delta V$.

The gate of FET 26 responds to the output signal from FET 22, and the drain of FET 26 is coupled through capacitor 34 to the gate of FET 36 in the buffer amplifier 38. The drain of FET 36 is supplied with operating voltage from the voltage source V1 through FET 40 (which acts as a load device), and it also is coupled through a capacitor 42 to the input node 44 of the pre-latch circuit 46. The buffer 38 provides a low output impedance through which the high-gain amplifier 24 can drive the pre-latch circuit 46. During the preconditioning period described hereinafter, the input and output nodes of FET 36 are momentarily interconnected by FET 48 for self-biasing the buffer 38 to its correct operating point.

The coupling capacitors 34 and 42 enable the amplifier stages to be independently self-biased as described elsewhere herein. Self-biasing eliminates the need for additional bias voltage and power sources and the problem of offsets caused by bias sensitivity and supply voltage drifts.

The pre-latch circuit 46, FIG. 1, is fully disclosed in the copending application of L. G. Heller and D. P. Spampinato entitled "Cross-Couple Charge Transfer Sense Amplifier Circuits", Ser. No. 656,677, filed Feb. 9, 1976 (IBM Docket Y09-75-016). As utilized herein, this circuit will be described with reference to those phases of its operation which occur respectively during the preconditioning period and the comparison period (FIG. 2) in the operation of the comparator.

In the comparison phase of its operation, the pre-latch circuit 46 may assume either of two stable unbalanced states according to the polarity of the amplified voltage-difference signal applied to its input node 44. During the preconditioning period it is placed in a neutral balanced state herein called a "precharged"-state. This circuit 46 includes two FETs 50 and 52 and two capacitors 54 and 56, these devices being arranged in a cross-coupled charge transfer relationship. Thus, the gate of FET 50 is connected to one electrode of capacitor 54 and also to a node 60, which is connected to the drain electrode of FET 52. The gate of FET 52 is connected to one electrode of capacitor 56 and also to a node 58 connected to the drain of FET 50. The manner in which the other electrodes of the capacitors 54 and 56 are energized will be explained presently. The source of FET 50 is connected to the input node 44 of pre-latch circuit 46. The source of FET 52 is connected to a node 62 which is coupled to ground by capacitor 64.

Nodes 58 and 60 periodically are supplied with potential from a voltage source $V_2$ through FETs 66 and 68, respectively, during the precharge phase in the operation of circuit 46, as described hereinafter. Nodes 44 and 62 periodically are connected to ground through FETs 70 and 72, respectively, as will be explained. The useful output signal of the pre-latch circuit 46 is the voltage which exists between the nodes 58 and 60 when the comparison phase of its operation is completed.

Various parasitic or distributed capacitors exist in the illustrated circuitry. The ones to which attention will be given specifically herein are the following: capacitor 74 between the gate and source of FET 32, capacitor 76 between the gate and source of FET 48, and capacitor 78 between the node 44 and ground (representing the distributed capacitance of the input line from the buffer 38 to the prelatch circuit 46).

CIRCUIT OPERATION

Figure 2:
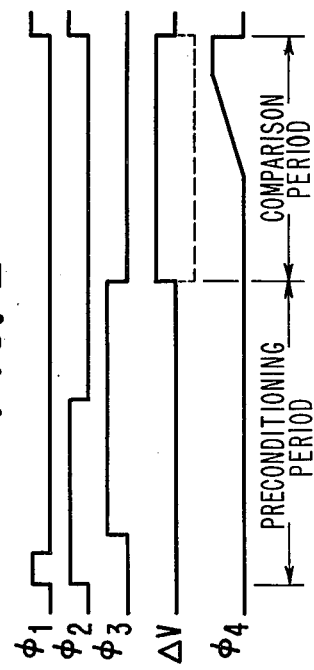
FIG. 2 is a timing diagram to show the sequential relationship among various voltage pulses which are applied to various parts of the circuitry shown in FIG. 1.

As depicted in the timing diagram, FIG. 2, the operating cycle of the illustrated MOS comparator is divided into a preconditioning or set-up period and a succeeding comparison period. At the beginning of the cycle two control pulses designated as "phase 1" ($\phi_1$) and "phase 2" ($\phi_2$) voltages are applied respectively to the gates of the FETs 32 and 48, which thereby are activated to interconnect the gate and drain of the high-gain amplifier FET 22 and the gate and drain of the buffer amplifier FET 36, respectively. This action biases the amplifiers to their unity-gain points. The phase 1 voltage also is applied to the gates of FETs 70 and 72 in the pre-latch circuit 46, thereby grounding the nodes 44 and 62, respectively, and dissipating any charge that may have been left in the capacitors 78 and 64 from the previous comparing operation. During this preconditioning period the differencing circuit 10 is initialized as explained above so that no difference voltage $\Delta V$ appears at node 16 during this time.

The $\phi_1$ voltage pulse terminates a short time later, while the $\phi_2$ voltage still is being applied to the gate of FET 48. The termination of the $\phi_1$ voltage pulse turns off FET 32, thereby interrupting the input-output connection between the gate and drain electrodes of FET 22 and leaving the gate of FET 22 floating at its unity-gain operating point. However, termination of the applied $\phi_1$ voltage pulse also generates a transient voltage pulse which is coupled through the parasitic capacitor 74 to the gate of FET 22, and this transient pulse becomes amplified by the high-gain amplifier 24 and is applied through the capacitive coupling 34 to the gate of the buffer amplifier FET 36. In a conventional comparator circuit the sensitivity threshold is made high enough so that the circuit responds only to those true signals which are much larger than the transient pulses. In the present circuit it is not necessary to make this sacrifice of sensitivity because means are provided for rendering the transient signals harmless or ineffective. One such means now will be described:

Referring to the timing diagram, FIG. 2, it can be seen that when the $\phi_1$ voltage pulse ends, thereby creating the aforesaid transient signal which is applied to the input node of buffer amplifier 38, the $\phi_2$ voltage at that time still is being applied to the gate of FET 48 in the buffer amplifier 38. Hence, the gate and the drain electrodes of FET 36 are at this instant still interconnected through FET 48, which is being maintained on by $\phi_2$, and the transient pulse received by the buffer 38 from the high-gain amplifier 24 is absorbed in the buffer 38. This effectively blocks the highly amplified transient pulse that has just been produced by the high-gain amplifier 24 so that it cannot pass through the buffer 38 and reach the pre-latch circuit 46.

As the $\phi_1$ voltage pulse ends (FIG. 2), a phase 3 ($\phi_3$) voltage pulse is applied to the gates of the FETs 66 and 68 in the pre-latch circuit 46, FIG. 1, causing these FETs to operate in their linear regions where they function as resistors. Supply voltage $V_2$ now is applied through FET 66 and node 58 to one electrode of capacitor 56, and also through FET 68 and node 60 to one electrode of capacitor 54. The other electrodes of the capacitors 54 and 56 are connected to a terminal to which phase 4 ($\phi_4$) voltage is supplied. At this time the $\phi_4$ voltage is at its lowermost level (e.g., ground potential). The capacitors 54 and 56 become charged so that the nodes 58 and 60 reach the potential of $V_2$.

As previously explained, the nodes 58 and 60 respectively are cross-connected to the gates of FETs 52 and 50. When capacitors 54 and 56 are fully charged, and the nodes 58 and 60 are at the potential of $V_2$, the FETs are caused to operate in their saturation regions, where they conduct current from nodes 58 and 60 through the drains FETs 50 and 52 to nodes 44 and 62 at the sources of FETs 50 and 52, thereby charging the capacitors 78 and 64. As the capacitors 78 and 64 charge, the source voltages of FETs 50 and 52 are raised, and when the source voltage $V_S$ of FET 50 and 52 reaches a level equal to the difference between the respective gate voltage $V_g$ and the threshold voltage $V_{th}$ of that device, cutoff of the device occurs. When both FETs 50 and 52 have been cut off, the node 44 is at a potential which is lower than $V_2$ by an amount equal to the threshold voltage of FET 50, and the node 62 is at a potential which is lower than $V_2$ by an amount equal to the threshold voltage of FET 52. Nodes 58 and 60 are at the potential of $V_2$.

It is important to note that the FETs 50 and 52 need not have identical threshold voltages in order that the pre-latch circuit 46 may function properly. A balanced condition, with both FETs 50 and 52 cut off, is achieved even though these FETs may cut off at different source voltage levels.

If it is desired that a very abrupt cutoff of devices 50 and 52 occur during the precharge period, this can be achieved in several ways. One method is to terminate the $\phi_3$ pulse and thereby turn off the FETs 66 and 68 at a time when the charge-transfer devices 50 and 52 are still conductive but in a close-to-cutoff state. This produces negative transients on nodes 58 and 60, thereby forcing a hard cutoff of FETs 50 and 52. This result can be aided by enhancing the gate-to-souce capacitance of each of the FETs 66 and 68.

Referring again to FIG. 2, it will not noted that the $\phi_2$ voltage pulse terminates during the pulse period of the $\phi_3$ voltage; therefore the $\phi_2$ pulse ends while the pre-latch circuit 46 is still in the precharge phase of its operation. The transient pulse that results when $\phi_2$ is switched off (thereby turning off the device 48) will be coupled through the parasitic capacitor 76 to the gate of the buffer amplifier FET 36, which transmits a corresponding output pulse through the coupling capacitor 42 to the input node 44 of the pre-latch circuit 46. At this time, however, circuit 46 is in its precharge phase during which the source nodes 44 and 62 of the FETs 50 and 52 are being charged up to their cutoff levels. This transient pulse is of relatively low magnitude inasmuch as buffer 38 is not a high-gain amplifier. Under these conditions the transient pulse that passes through buffer 38 to the input source node 44 merely becomes absorbed in the precharge voltage that currently is being built up on that node for driving the FET 50 to its cutoff state.

Thus, it is apparent that when the $\phi_1$ and $\phi_2$ voltages are switched off for placing amplifiers 24 and 38 in their self-biased operating states during the preconditioning period, any transient signals produced by these switching actions will be fully absorbed by one means or another in the manner explained above. Any transient which results when $\phi_3$ switches off will be of slight magnitude and will only enhance the precharging effect. At the end of the preconditioning period, when the $\phi_1$, $\phi_2$ and $\phi_3$ voltage pulses have subsided, pre-latch circuit 46 is in a balanced state with its output nodes 58 and 60 at equal potentials and with all of its constitutent FETs turned off.

At the beginning of the comparison phase, as described above, a difference voltage $\Delta V$ having a polarity determined by the relative magnitude of the input signal $V_A$ and the reference voltage $V_B$ is produced at the output node of the differencing circuit 10. This difference signal is amplified by the high-gain amplifier and is passed through the buffer 38 to the input node 44 of the pre-latch circuit 46. Depending, therefore, upon the polarity of the amplified difference signal $\Delta V$, the potential at node 44 will be raised or lowered accordingly. This action will be amplified when a $\phi_4$ ramp voltage pulse is applied to the common electrode of the capacitors 54 and 56, thereby enhancing the charge transfer action of the pre-latch circuit 46.

Assume, for example, that $\Delta V$ is of negative polarity. As the $\phi_4$ voltage rises, the gate voltages of FETs 50 and 52 are ramped upwardly, but since the voltage at the source node of FET 50 also has been raised by application of the amplified and inverted $\Delta V$ difference signal thereto, FET 50 is prevented from conducting current despite the rise in its gate voltage. Hence, capacitor 56 is prevented from transferring any substantial part of its charge through FET 50, and the potential on node 58 (connected to the drain of FET 50 and cross-connected to the gate of FET 52) continues to rise. When the gate voltage of FET 52 rises high enough in relation to the source voltage thereof to render FET 52 conductive, positive charge transfer now takes place from capacitor 54 through FET 52 to capacitor 64, which has sufficient capacitance to cause a very substantial depletion of the charge on capacitor 54. This reduces the voltage at the node 60, which is the drain voltage of FET 52, and eventually FET 52 is taken out of saturation into its linear region, after which no further significant charge transfer occurs. The lowering of the voltage at node 60 also causes a like reduction of voltage on the gate of FET 50, thus insuring that FET 50 remains cut off. Hence, when $\Delta V$ is negative, pre-latch circuit 46 ultimately assumes a state in which the voltage at node 60 is lower than the voltage at node 58 by an amount at least equal to the threshold voltage of FET 50.

If the difference voltage $\Delta V$ is of positive polarity, the opposite action will take place. The source voltage of FET 50 at the node 44 will be decreased as the amplified and inverted difference signal is applied to it, and the FET 50 will start to conduct as soon as the difference between its gate and source voltages exceeds its threshold voltage. The $\phi_4$ ramp enhances the difference in conduction between devices 50 and 52. As FET 50 conducts, positive charge is transferred from capacitor 56 through FET 50 to capacitors 42 and 78. This process continues until FET 50 is taken out of saturation into its linear region, causing a substantial reduction of voltage at node 58. The voltage at node 60 (i.e., the drain of FET 52) continues to rise, while the voltage on the gate of FET 52 (same potential as node 58) is falling, thereby maintaining FET 52 in cutoff state. Hence, when $\Delta V$ is positive, pre-latch circuit 46 ultimately assumes a state in which the voltage at node 58 is lower than the voltage at node 60 by an amount at least equal to the threshold voltage of FET 52.

By the end of the comparison period, when the output voltage between the nodes 58 and 60 is sensed, a readily detectable signal will have been produced across these nodes by the pre-latch circuit 46. This signal is not affected by transients or offsets in the circuitry and very accurately represents the plus or minus polarity of the initial voltage difference ΔV even though this difference is only on the order of one millivolt or less. By actual experiment it has been found that voltage differences of less than one millivolt can be reliably detected in a few microseconds. The circuit parameters utilized in the experimental embodiment are as follows:

| Capacitance values: | |
|---|---|
| Capacitors 12, 14 & 34 | 50 picofarads |
| Capacitors 42 & 64 | 5 picofarads |
| Capacitors 54 & 56 | 0.5 picofarad |

| Width/length ratios of FET's: | |
|---|---|
| FET | W/L |
| 22, 26, 50 & 52 | 15/1 |
| 28 & 30 | 1/6.6 |
| 32, 48, 70 & 72 | 1/1 |
| 36 | 25/1 |
| 40 | 5/1 |
| 66 & 68 | 4/1 |

In this model the complete cycle time is 2.9 microseconds. Nominal voltage gain in the amplifiers is 130. Nominal power of the comparator is approximately 3 milliwatts. Sensitivity threshold is about one-half millivolt. Further optimization through speed-versus-sensitivity tradeoffs or other improvements are possible.

The illustrated embodiment has been described on the assumption that the FETs are of the N-channel enhancement type. Obviously, however, the principle of the invention can be applied as well to an embodiment in which one or more of the FETs function in the depletion mode.

In the illustrated embodiment, several stages of amplification are interposed between the differencing circuit 10 and the pre-latch circuit 46, and the control pulses are so timed that $\phi_2$ overlaps $\phi_1$, while $\phi_3$ overlaps $\phi_2$, all for the purpose of absorbing transients which are generated respectively when the $\phi_1$ and $\phi_2$ pulses terminate, as explained above. It would be possible to operate the system in modified form by eliminating one of the amplifier stages (the buffer amplifier 38, for instance) and making a corresponding adjustment in the timing of the control pulses (by overlapping $\phi_1$ and $\phi_3$ for example). Modifications such as these can be made without relinquishing the advantage which is realized by the sequential switching mode described herein, whereby the transient that is generated each time the biasing connection in an amplifier stage is switched off (such as occurs when FET 32 is turned off, for example) will be absorbed in the next stage of the circuitry which then is being conditioned to prevent any further passage of the transient.

While the invention has been particularly shown and described with reference to the preferred embodiment thereof, it will be understood by those skilled in the art that the foregoing and other changes in form and details may be made therein without departing from the spirit and scope of the invention.

What is claimed is:
1. A voltage comparator comprising
   a differencing circuit for producing a difference signal indicating the polarity of the difference between two input signals,
   an amplifier having an input node for receiving said difference signal and an output node for manifesting an amplified signal,
   first switching means effective when placed in a first state to establish a biasing connection for setting said amplifier at a predetermined operating point which will be maintained after such connection is interrupted and effective when placed in a second state to interrupt such connection, leaving said amplifier biased at said operating point,
   output circuitry for receiving signals manifested at the output node of said amplifier, said output circuitry including at least one stage which can be set to a first condition wherein it is incapable of responding to any signal manifested at said amplifier output node and settable thereafter to an alternative condition in which it is responsive to such a signal,
   second switching means effective when placed in a first state to set said output stage in said first condition thereof and effective when placed in a second state to set said output stage in an alternative condition wherein it responds to the amplifier output signal,
   and control means for causing said first switching means and said second switching means to operate in a timed relationship such that said second switching means is in its first state at the time when said fist switching means changes from its first state to its second state, whereby said output stage assumes its first condition during the time when a transient signal is being generated by interruption of the biasing connection in such amplifier and thereafter assumes an alternative condition responsive to the amplified difference signal at a time when said transient signal does not exist.

2. A voltage comparator as defined in claim 1 wherein said differencing circuit comprises
   a pair of passive MOS capacitors each having an electrode connected to a common output node and having another electrode connected to a respective one of two input nodes to which said input signals respectively are applied,
   and switching devices for conditioning said capacitors so that the difference signal manifested at said common output node has a polarity which denotes the relative magnitudes of said input signals.

3. A voltage comparator as defined by claim 1 wherein said amplifier includes an FET having a gate to which the difference signal produced by said differencing circuit is applied and a drain at which an amplified signal can be manifested, said switching means being effective in its first state to interconnect said gate and drain and being effective in its second state to interrupt such connection.

4. A voltage comparator as defined by claim 1 wherein said one stage of said output circuitry comprises an FET latching circuit capable of assuming an initial neutral condition wherein it is unresponsive to signals received from said amplifier and capable of switching from said initial condition to a second condition wherein it can assume either of two alternative final states in response to the polarity of a signal received from said amplifier.

5. A voltage comparator comprising
   a differencing circuit for producing a difference signal indicating the polarity of the difference between two input signals, a first amplifier having an input node for receiving said difference signal and an output node for manifesting an amplified signal, first switching means effective when placed in a first state to establish a biasing connection for setting said first amplifier at a predetermined operating point which will be maintained after such connection is interrupted and effective when placed in a second state to interrupt such connection, leaving said amplifier biased at said operating point, a buffer amplifier having an input node for receiving a signal manifested at the output node of said first amplifier and having an output node for manifesting an amplified signal, second switching means effective when placed in a first state to establish a biasing connection for setting said buffer amplifier at a predetermined operating point which will be maintained after such connection is interrupted and effective when placed in a second state to interrupt such connection, said buffer amplifier being unresponsive to signals received at its input node while said switching means is in its first state, a latching circuit for receiving signals manifested at the output node of said buffer amplifier, said latching circuit being capable of assuming an initial neutral condition wherein it is unresponsive to signals received from said buffer amplifier and capable of switching from said initial condition to a second condition in which it can assume either of two alternative final states in accordance with the polarity of the signal received from said buffer amplifier, third switching means effective when placed in a first state to place said latching circuit in its initial neutral condition and effective when placed in a second state to set said latching circuit to its second condition wherein it assumes one of its alternative final states according to said amplified signal polarity, and control means for causing said first, second and third switching means to operate in a timed relationship such that said second switching means is in its first state when said first switching means changes from its first state to its second state, and said third switching means is in its first state when said second switching means changes from its first state to its second state, whereby any transient signal which is generated by interruption of the biasing connection to said first amplifier is absorbed in said buffer amplifier, and any transient signal which is generated by interruption of the biasing connection to said buffer amplifier is absorbed in said latching circuit, thus insuring that the final state of said latching circuit is determined by the polarity of said difference signal independently of said transient signals.

6. A voltage comparator as defined by claim 5 wherein said differencing circuit comprises:

a pair of passive MOS capacitors each having an electrode connected to a common output node and having another electrode connected to a respective one of two input nodes to which said input signals respectively are applied, and switching devices for conditioning said capacitors so that the difference signal manifested at said common output nodes has a polarity which denotes the relative magnitudes of said input signals.

7. A voltage comparator as defined by claim 5 wherein each of said amplifiers includes an FET having a gate connected to said input node and a drain at which an amplified signal can be manifested, each of said first and second switching means being effective in its first state to interconnect the gate and drain of its respective amplifier FET and being effective in its second state to interrupt said connection.

8. A voltage comparator as defined by claim 5 wherein said latching circuit includes the following elements:

an input node coupled to the output node of said buffer amplifier, first and second output nodes between which there can be manifested, whenever said latching circuit is in one of its alternative final states, an amplified output voltage whose polarity represents the final state of said latching circuit, thereby denoting the relative magnitude of the original input voltages applied to said differencing circuit, first and second FETs each having source, gate and drain electrodes, the source of said first FET being connected to said input node, first and second capacitors, means providing a common connection among said first capacitor, the gate of said first FET, the drain of said second FET and the second of said output nodes, and means providing a common connection among said second capacitor, the gate of said second FET, the drain of said first FET and the first of said output nodes, said third switching means being effective in its first state to place said first and second output nodes at substantially the same potential for concurrently charging said capacitors to a predetermined level and being effective in its second state to permit the development of an output voltage between said output nodes by the selective discharge of said first or second capacitor through said second or first FET, respectively, according to the polarity of the signal furnished by said buffer amplifier to said latching circuit.

* * * * *